(12) United States Patent
Jiang et al.

(10) Patent No.: US 6,977,600 B2
(45) Date of Patent: Dec. 20, 2005

(54) DETERMINING ANALOG ERROR USING PARALLEL PATH SAMPLING

(75) Inventors: Jian H. Jiang, Sunnyvale, CA (US); Yasuo Hidaka, Santa Clara, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/821,034

(22) Filed: Apr. 8, 2004

(65) Prior Publication Data
US 2005/0184898 A1 Aug. 25, 2005

Related U.S. Application Data

(60) Provisional application No. 60/546,145, filed on Feb. 20, 2004.

(51) Int. Cl.[7] .............................. H03M 1/00; G05F 1/10
(52) U.S. Cl. ...................... 341/136; 341/156; 341/172; 327/540; 327/538
(58) Field of Search ................................ 341/136, 156, 341/166, 172, 163; 327/540, 538

(56) References Cited

U.S. PATENT DOCUMENTS

| | | | |
|---|---|---|---|
| 5,266,952 A | 11/1993 | Stone et al. ................. 341/156 |
| 6,160,441 A * | 12/2000 | Stratakos et al. ........... 327/540 |
| 6,177,899 B1 * | 1/2001 | Hsu ............................. 341/156 |
| 6,313,780 B1 | 11/2001 | Hughes et al. .............. 341/156 |
| 6,753,801 B2 * | 6/2004 | Rossi .......................... 341/161 |
| 6,867,724 B2 * | 3/2005 | Colonna et al. ............ 341/172 |
| 2002/0175843 A1 | 11/2002 | Sonkusale et al. .......... 341/120 |
| 2003/0080894 A1 | 5/2003 | Konno ........................ 341/162 |

FOREIGN PATENT DOCUMENTS

WO WO 2004/010586 7/2003 ........... H03M 1/00

OTHER PUBLICATIONS

European Search Report mailed May 25, 2005 re EP Application No. 05 25 0673 (3 pages).
Bracey, et al., "A 70 MS/s 8-Bit Differential Switched-Current CMOS A/D converter Using Parallel Interleaved Pipelines" pp. 143-146, © 1995 IEEE.

* cited by examiner

Primary Examiner—Lam T. Mai
(74) Attorney, Agent, or Firm—Baker Botts L.L.P.

(57) ABSTRACT

A method for determining analog error of a signal includes receiving an input signal and sampling the input signal to generate a first sampled signal. The method also includes communicating the first sampled signal using a first communication path and a second communication path and sampling the first sampled signal from the first communication path to generate a second sampled signal. The method further includes converting the first sampled signal from the second communication path into a digital signal, storing the digital signal using a digital memory, comparing the second sampled signal to the digital signal, and determining an analog error of the input signal based on the comparison.

20 Claims, 3 Drawing Sheets

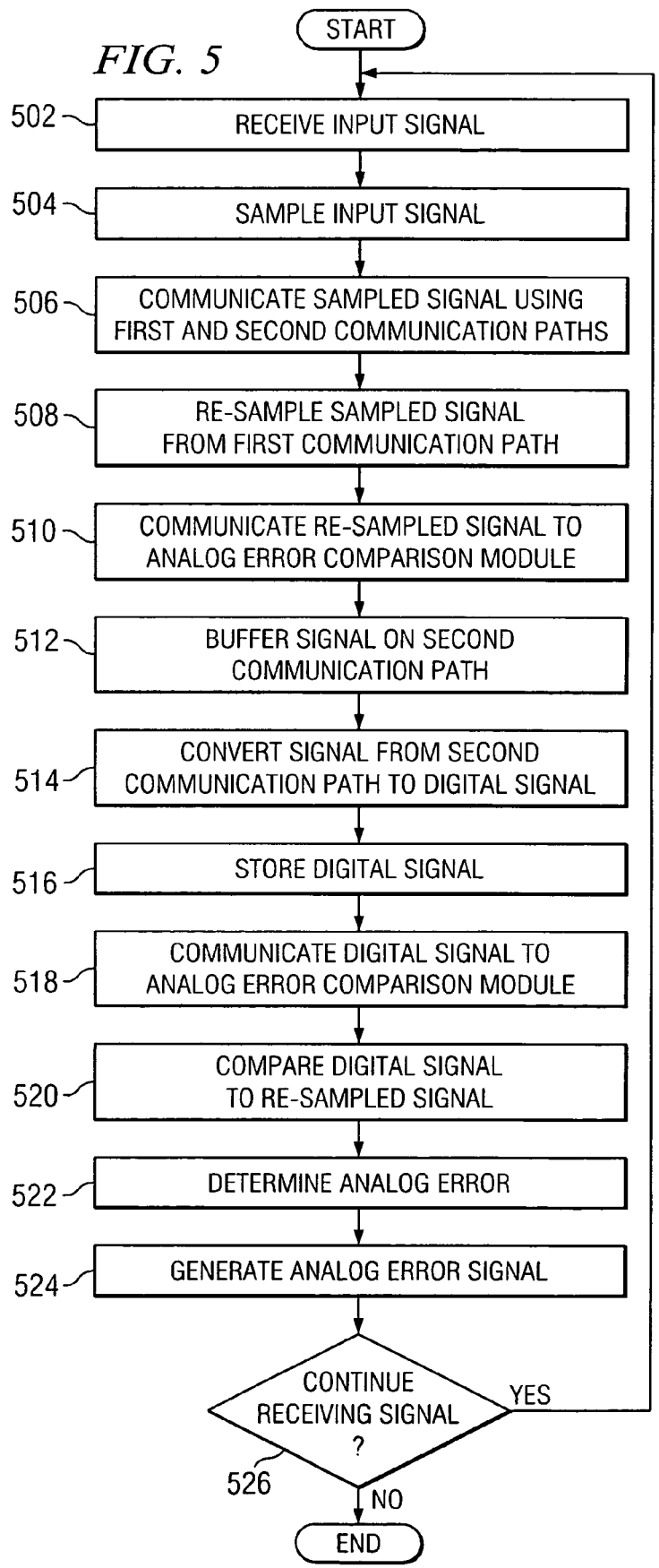

DETERMINING ANALOG ERROR USING PARALLEL PATH SAMPLING

RELATED APPLICATIONS

This application claims the benefit of U.S. Provisional Application Ser. No. 60/546,145 filed Feb. 20, 2004.

TECHNICAL FIELD OF THE INVENTION

This invention relates in general to sampling methods for determining signal error, and more particularly to a method and system for determining analog error using parallel paths.

BACKGROUND OF THE INVENTION

High frequency signal applications have created a need to determine analog error at an extremely high rate. Unfortunately, the high frequencies place significant demands on sampling and analysis circuitry. Although the sampling and error analysis can be performed, it requires several high speed components, which may be expensive and/or difficult to implement in circuitry designs.

SUMMARY OF THE INVENTION

In one embodiment of the present invention, a method for determining analog error of a signal includes receiving an input signal and sampling the input signal to generate a first sampled signal. The method also includes communicating the first sampled signal using a first communication path and a second communication path and sampling the first sampled signal from the first communication path to generate a second sampled signal. The method further includes converting the first sampled signal from the second communication path into a digital signal, storing the digital signal using a digital memory, comparing the second sampled signal to the digital signal, and determining an analog error of the input signal based on the comparison.

Particular embodiments of the present invention may provide various technical advantages. One technical advantage of particular embodiments is reducing the number of high frequency components required to perform sampling and analysis. Particular embodiments of the present invention allow certain components to function at a relatively lower frequency compared to the frequency of the input signal. This allows circuits to be constructed with fewer high frequency components. The reduction in the number of high frequency components reduces the overall costs of the circuit as well as simplifying circuit design.

Another technical advantage of particular embodiments is reduced difficulty associated with latency. In sampling and analysis circuits that operate at high speeds, the latency introduced into the circuit by the operation of components may cause the feedback to lag slightly behind the input signal. This may result in errors and/or inefficient function in the circuit. By rearranging the analysis circuit into parallel paths, particular embodiments of the invented circuit may reduce the need for high-speed feedback, which may reduce the difficulties associated with latency.

Still another technical advantage of particular embodiments of the present invention is reduction of state dependency. Particular embodiments of the present invention may be adapted to use equalization after sampling. This allows sampling switches to clear their states after each sampling iteration. Because it may take a significant amount of time compared to the period of the signal to switch a particular value of a sampling switch from, for example, high to low, not initializing the switch after every iteration may introduce inappropriate time delays, known as "jitter." By allowing equalization after switch iterations, particular embodiments of the present invention reduce problems associated with jitter. These and other aspects may help to enable applications that involve high-speed analog error analysis.

Other technical advantages may be realized in various embodiments of the present invention. Moreover, while specific advantages have been enumerated, particular embodiments may include all, some, or none of the enumerated advantages.

BRIEF DESCRIPTION OF THE DRAWINGS

FIG. 5 is a flowchart illustrating an example method of operation for the circuit of FIG. 1.

DETAILED DESCRIPTION OF THE INVENTION

Figure 1:
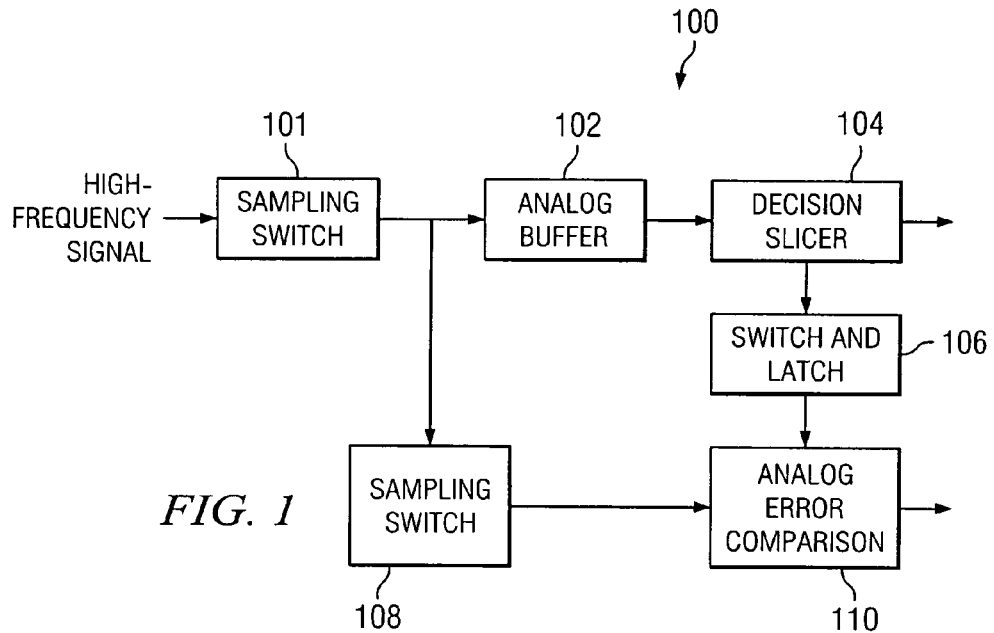
FIG. 1 illustrates a circuit that performs sampling and analysis of analog error.

FIG. 1 illustrates a circuit 100 used to perform analysis of analog error. In the depicted embodiment circuit 100 includes a sampling switch 101, an analog buffer 102, a decision slicer block 104, a switch-and-latch combination 106, a second sample switch 108, and an analog error comparison module 110. Generally, circuit 100 samples an input signal and calculates the degree of analog error. "Analog error" refers generally to the amount of deviation in amplitude between an incoming signal and the nominal high value of a corresponding digital system. The analog error is useful for determining the performance of a system and identifying areas of the system that may be degrading performance, such as components consuming an excessive amount of power.

Sampling switches 101 and 108 represent any suitable components for receiving a high frequency signal, taking the value at predetermined time intervals in the signal, and outputting that value. Sampling switches 101 and 108 are capable of sampling signals in the gigahertz range. Sampling switches 101 and 108 may include any suitable electronic components, including components such as transistors, resistors, and constant current sources. Sampling switches 101 and 108 may advantageously include several high-speed components to allow sampling of high-frequency signals.

Analog buffer 102 represents any suitable components for storing an incoming analog signal. Analog buffer 102 may include any suitable combination of electronic components or other forms of signal storage. In the depicted embodiment, analog buffer 102 buffers the output signal of first sample switch 101.

Decision slicer block 104 represents any suitable components for converting the output of analog buffer 102 into a digital signal. Decision slicer 104 may include any combination of electronic or other components for analog to digital conversion. In a particular embodiment, decision slicer 104 includes several metal oxide semiconductor effect transistors (MOSFETs). In general, any suitable analog-to-digital converter may function as decision slicer 104.

Switch-and-latch 106 represents any suitable components for switching between binary states and latching the result of the switching process in response to input from decision slicer block 104. Because the input to switch-and-latch 106 is sampled from the original high frequency signal, switch-and-latch 106 only needs to be able to respond quickly enough to capture signals at the sampling rate rather than the rate of the original signal. Accordingly, switch-and-latch 106 may be constructed using a variety of conventional components without requiring relatively high frequency responses. In general, any suitable digital memory may perform the functions of switch-and-latch 106.

Analog error comparison 110 represents any components for comparing the information stored by switch-and-latch 106 to the information output by second sampling switch 108. Analog error comparison 110 may also include amplification circuitry to amplify the magnitude of the analog error to a detectable level. The accuracy of analog error comparison module 110 may be set by using precision components to a level desired. In general, analog error comparison module 110 may include any of a variety of electronic components useful for comparing voltages to one another.

In operation, circuit 100 receives a high frequency signal. Sampling switch 101 samples values from the input signal and outputs the sampled values as an analog signal to analog buffer 102 and second sampling switch 108. Analog buffer 102 stores the information received from sampling switch 101 and passes the information to slicer block 104 with the associated buffering delay. The amount of buffering in analog buffer 102 may be set to appropriately adjust the time delay between sampling switch 101 and slicer block 104. Decision slicer 104 converts the analog output of analog buffer 102 into a digital signal, which is stored in switch-and-latch 106.

On the parallel path, second sampling switch 108 re-samples the output of first sampling switch 101 to produce a lower-speed re-sampled signal. Second sampling switch 108 then provides the re-sampled signal to analog error comparison 110. Analog error comparison 110 then compares the magnitude of the analog signal from sampling switch 108 to the expected digital values from switch-and-latch 106. This allows calculation of the analog error. Analog error comparison 110 may also amplify the analog error to an easily measurable level.

According to a particular embodiment, sample switches 101 and 108 may include equalization modules. The equalization module is controlled according to an external timing scheme that resets sampling switches 101 and 108 in between sampling cycles. This reset reduces jitter associated with switching the value of sample switches 101 and 108 from, for example, a high value to a low value. Advantageously, signals may be provided to sampling switches 101 and 108 as differential inputs. In that case, the sum of the signals is naturally the average value of the signal. Thus, the equalization module can quickly reinitialize the storage in sampling switches 101 and 108 respectively.

In general, the timing between paths must be fairly equally matched in order for analog error comparison 110 to perform an accurate comparison. Accordingly, components such as analog buffer 102, decision slicer block 104, and switch-and-latch 106 may be advantageously selected to correspond to multiples of the original incoming frequency of the input signal. Similarly, sampling switch 108 may be set to sample with a particular timing so that the timing between the parallel paths to analog error comparison 110 may be synchronized.

Although a particular embodiment of circuit 100 has been described, numerous other embodiments are also possible. For example, the functions performed by particular components may be performed by different or additional components. Also, such functions may be distributed between one or more components, and functions current distributed among several components may be consolidated into fewer components. Furthermore, any suitable rearrangement or combination of the described components may be used as well.

Figure 2:
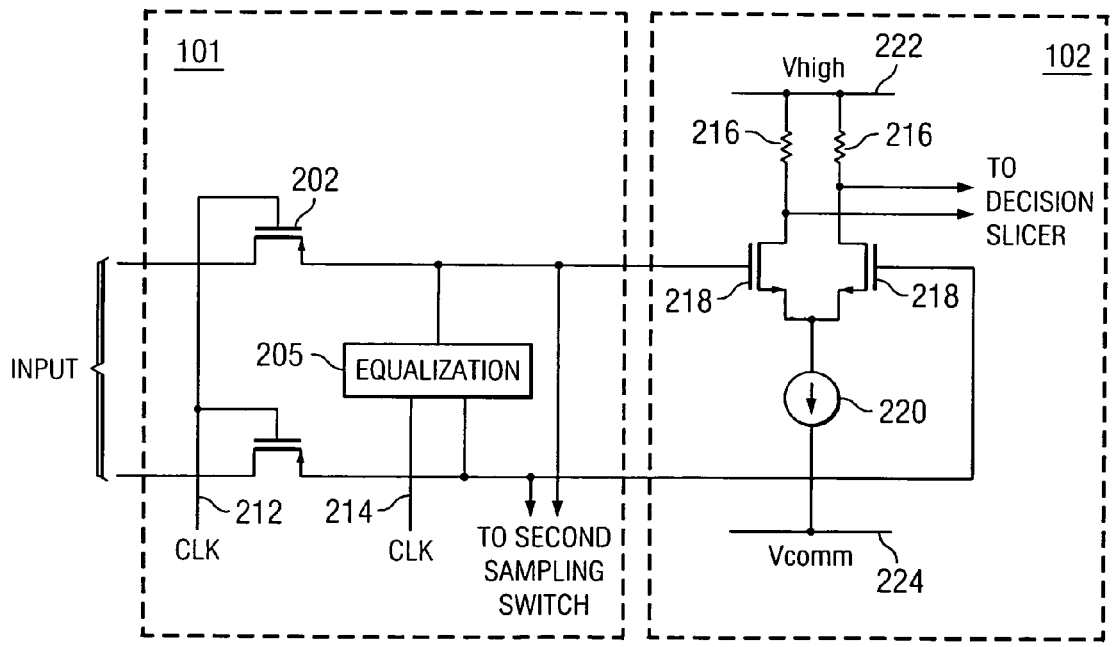
FIG. 2 illustrates a particular embodiment of a sampling switch and analog buffer in the circuit of FIG. 1.

FIG. 2 shows a particular embodiment of sampling switch 101 and analog buffer 102 in detail. In the depicted embodiment, sampling switch 101 includes two positive carrier type MOSFETs (PMOSs) 202 and 204. Sampling switch 101 also includes an equalization module 206. Sampling switch 101 samples from a differential input that includes the input signal 208 and its negative 210. PMOSs 202 and 204 are triggered by a clock signal 212 which causes switch 101 to produce output by turning on transistors 202 and 204. The output of sampling switch 101 may be measured across equalization module 206. Once sampling is complete, a second clock signal 214 triggers equalization module to reset the output voltage of sampling switch 101, allowing sampling switch 101 to more easily reach the initial value the next time sampling is triggered.

Analog buffer 102 includes resistors 216, negative carrier-type MOSFETs (NMOSs) 218, and a constant current source 220. Analog buffer 102 establishes a voltage drop between a high value 222 and a common value 224. The output of analog buffer 102 is measured between the terminal of resistors 216 coupled to NMOSs 218 and common voltage 224. NMOSs 218 are controlled by the output signal of sampling switch 101. Because constant current source 220 regulates the rate of current flow, analog buffer 102 lags behind sampling switch 101 at a fixed rate.

In operation, sampling switch 101 receives a differential input for input signal that includes input signal 208 and its negative 210. When sampling switch 101 is triggered to sample by clock signal 212, transistors 202 and 204 allow current to flow through, which produces an output signal. The output signal in turn controls transistors 218 of analog buffer 102 which changes the voltage value between transistors 218 and resistors 216. The rate of change is fixed by constant current source 220. Thus, analog buffer 102 follows the output of sampling switch 101.

When sampling is complete, as indicated by clock switch 214, equalization module 206 reinitializes the value of sampling switch 101. This allows sampling switch 101 to more quickly respond to its differential input when a new signal is received, and sampling is triggered again. By setting the value of various components, the response times of sampling switch 101 and analog buffer 102 may be set accordingly.

Thus, sampling switch 101 provides an advantageous capability for sampling high-frequency signals. Although a particular embodiment of switch 101 has been described, numerous other embodiments nts are also possible. For example, the functions performed by particular components may be performed by different or additional components. Also, such functions may be distributed between one or more components, and functions current distributed among several components may be consolidated into fewer components. Furthermore, any suitable rearrangement or combination of the described components may be used as well.

Figure 3:
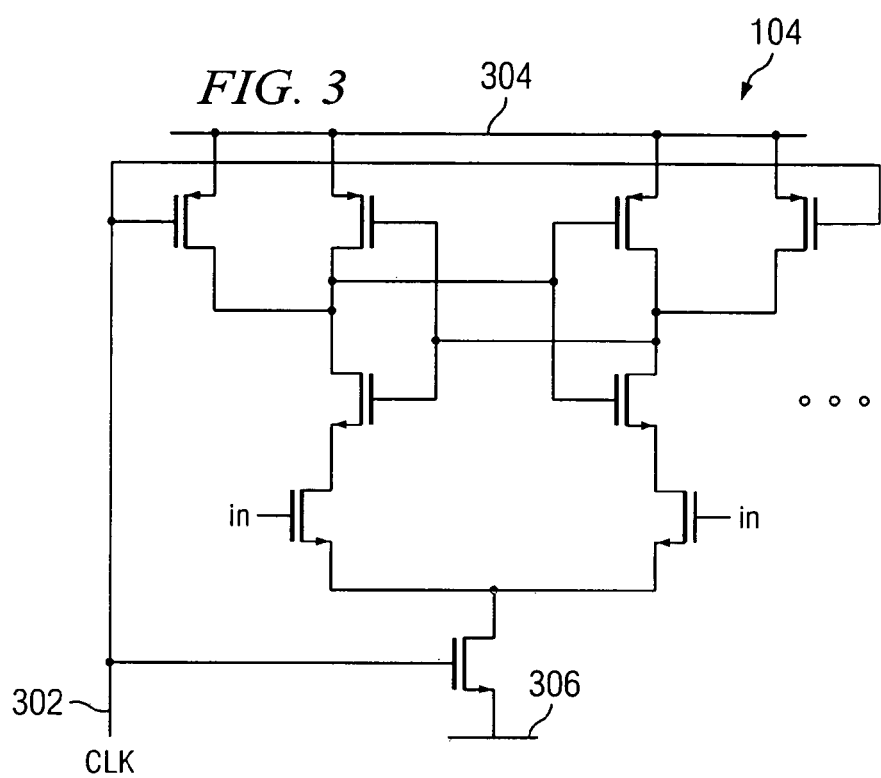
FIG. 3 illustrates a particular embodiment of a first stage for a decision slicer in the circuit of FIG. 1.

FIG. 3 illustrates a particular embodiment of decision slicer 104. Decision slicer 104 includes a collection of interworked MOSFETs in the configuration depicted. Slicer 104 receives input from analog buffer 102 as shown and produces high or low output depending on the manner in which MOSFETs are triggered by the input from analog buffer 102. This effectively draws current and produces voltage values using high voltage 304 and common voltage 306. Slicer 104 acts in response to a clock signal 302 which controls the timing of decision slicers production of output by controlling particular MOSFETs and slicer 104.

Thus, slicer 104 provides an advantageous capability of converting analog signals into digital signals. Although a particular embodiment of slicer 104 has been described, numerous other embodiments are also possible. For example, the functions performed by particular components may be performed by different or additional components. Also, such functions may be distributed between one or more components, and functions current distributed among several components may be consolidated into fewer components. Furthermore, any suitable rearrangement or combination of the described components may be used as well.

Figure 4:
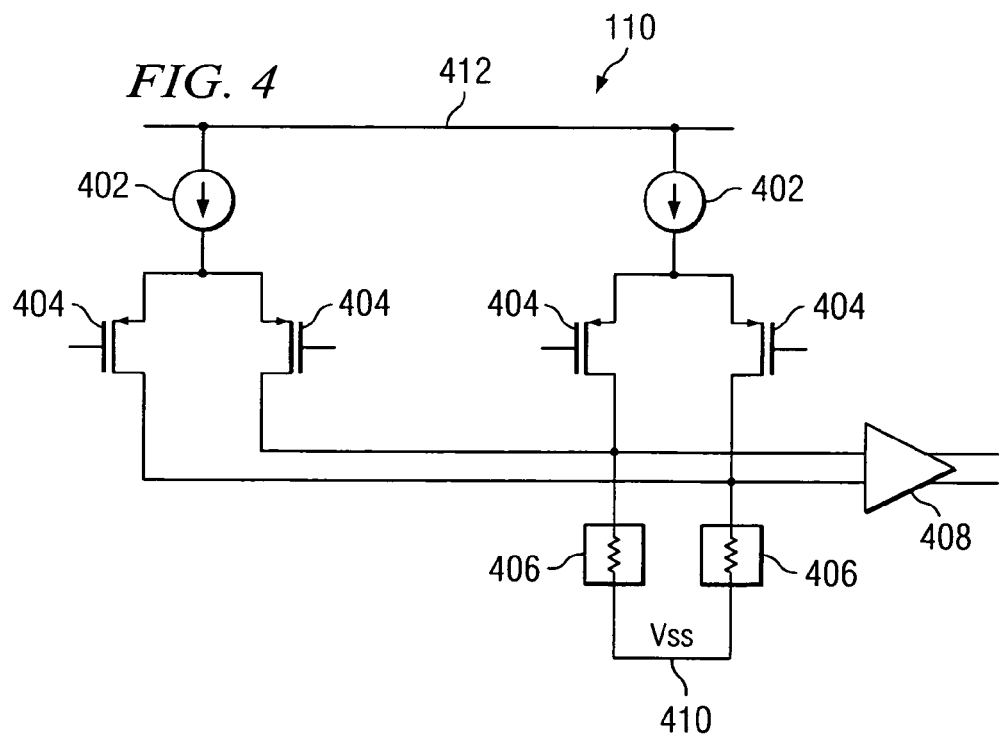
FIG. 4 illustrates a particular embodiment of an analog error comparison circuit used in the circuit of FIG. 1.

FIG. 4 shows a particular embodiment of analog error comparison module 110. In the depicted embodiment, analog error comparison module 110 includes constant current sources 402, PMOSs 404, resistors 406, and amplifier 408. One set of PMOSs 404 receives differential input from switch-and-latch 106, while the other set of transistors 404 receives input from second sampling switch 108. Resistors 406 allow a voltage drop between the input of amplifier 408 and common voltage 410. Constant current sources 402 regulate the rate of current flow from high voltage 412 through transistors 404.

In operation, transistors 404 are controlled by the input from switch-and-latch 106, while the remaining transistors 404 are controlled by input from sampling switch 108. This regulates the input to amplifier 408, which makes the output of analog error comparison 110 representative of the analog error. Effectively, analog error comparison 110 acts as a subtractor between the input signals provided to transistors 404.

Thus, analog error comparison module 110 provides an advantageous capability for determining analog error in a signal by comparison with a digital signal. Although a particular embodiment of analog error comparison module 110 has been described, numerous other embodiments are also possible. For example, the functions performed by particular components may be performed by different or additional components. Also, such functions may be distributed between one or more components, and functions current distributed among several components may be consolidated into fewer components. Furthermore, any suitable rearrangement or combination of the described components may be used as well.

FIG. 5 is a flow chart 500 illustrating one example for a method of operation for circuit 100. Sampling switch 101 receives an input signal at step 502. Sampling switch 101 samples the input signal to generate a sampled signal at step 504. Sampling switch 101 then communicates the sampled signal down two parallel communication paths at step 506. On the first communication path, sampling switch 108 re-samples the sampled signal to generate a re-sampled signal at step 508, and the re-sampled signal is communicated to analog error comparison module 110 at step 510.

On the second communication path, analog buffer 102 stores the sampled signal for a predetermined amount of time at step 512. Decision slicer 104 then converts the first sampled signal into a digital signal at step 514. Switch-and-latch 106 stores the digital signal for a period of time at step 516. Because the digital signal provided to switch-and-latch 106 is based on the sampled signal, switch-and-latch 106 does not need to respond to the digital signal at the input signal frequency, but rather at the sampling rate of sampling switch 101. After the digital signal has been stored for some amount of time, the digital signal is communicated to analog error comparison module at step 518.

Analog error comparison module 110 compares the re-sampled signal to the digital signal at step 520. Based on the comparison, analog error comparison module 110 determines the amount of analog error in the input signal at step 522. From this analog error, analog error comparison module 110 generates an analog error signal at step 524. The analog error signal may be amplified to a suitable level in order to facilitate detection by other components. If the input signal continues to be received, then the method may be repeated from step 502. Otherwise, the method ends.

The described method is only one example of many possible embodiments of methods of operation using circuit 100. In other embodiments, the steps enumerated above may be performed in a different order, and particular steps may be omitted. Additional steps may be added, and the described steps modified suitably for other embodiments of circuit 100. Such alternative embodiments, and in particular, any method of operation consistent with any of the embodiments described herein, should be understood to be within the scope of this disclosure.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. An apparatus for determining analog error of a signal, comprising:
   a first sampling switch operable to:
      receive an input signal; and
      sample the input signal to generate a first sampled signal;
   a second sampling switch coupled to the first sampling switch by a first communication path operable to:
      receive the first sampled signal from the first communication path; and
      sample the first sampled signal to generate a second sampled signal;
   an analog-to-digital converter coupled to the first sampling switch by a second communication path operable to:
      receive the first sampled signal from the second communication path; and
      produce a digital signal from the first sampled signal;
   a digital memory operable to store the digital signal; and
   an analog error comparison module operable to:
      compare the first sampled signal to the digital signal; and
      determine an analog error of the input signal based on the comparison.

2. The device of claim 1, further comprising an analog memory operable to:
   store the first sampled signal; and
   provide the first sampled signal to the analog-to-digital converter after a predetermined delay.

3. The device of claim 2, wherein:
   the analog memory comprises a constant current source operable to produce a current at a constant rate; and the predetermined delay is determined by the rate of the constant current source.

4. The device of claim 1, wherein the first sampling switch comprises an equalization module operable to reset the first sampling switch to an initial value a predetermined time after the first sampling switch samples a value from the input signal.

5. The device of claim 4, wherein:
the equalization module is a first equalization module; and
the second sampling switch comprises a second equalization module operable to reset the second sampling switch to an initial value for the second sampling switch a predetermined time after the second sampling switch samples a value from the first sampled signal.

6. The device of claim 1, wherein the digital memory comprises:
a switch; and
a latch operable to latch the value of the switch.

7. The device of claim 1, wherein:
the first sampling switch comprises at least two metal oxide semiconductor field effect transistors (MOSFETs); and
the primary carrier type of the MOSFETs is negative.

8. The device of claim 1, wherein the input signal has a frequency of at least one gigahertz.

9. A method for determining analog error of a signal, comprising:
receiving an input signal;
sampling the input signal to generate a first sampled signal;
communicating the first sampled signal using a first communication path and a second communication path;
sampling the first sampled signal from the first communication path to generate a second sampled signal;
converting the first sampled signal from the second communication path into a digital signal;
storing the digital signal using a digital memory;
comparing the second sampled signal to the digital signal; and
determining an analog error of the input signal based on the comparison.

10. The method of claim 9, further comprising storing the first sampled signal from the second communication path in an analog memory for a predetermined time, wherein the first sampled signal is converted to the digital signal after the first sampled signal has been stored for the predetermined time.

11. The method of claim 10, wherein:
the analog memory comprises a constant current source operable to produce current at a constant rate; and
the predetermined time is determined by the rate of the constant current source.

12. The method of claim 9, further comprising equalizing the first sampling switch to an initial value after the first sampling switch samples a value from the input signal.

13. The method of claim 12, further comprising equalizing the second sampling switch to an initial value for the second sampling switch after the second sampling switch samples a value from the first sampling signal.

14. The method of claim 9, wherein storing the digital signal comprises:
switching a switch in response to the digital signal; and
latching the value of the switch.

15. The method of claim 9, wherein:
the step of sampling the input signal is performed by a sampling switch;
the sampling switch comprises at least two metal oxide semiconductor field effect transistors (MOSFETs); and
the primary carrier type of the MOSFETs is negative.

16. The method of claim 9, wherein the input signal has a frequency of at least one gigahertz.

17. A circuit for determining analog error of a signal, comprising:
a first sampling switch comprising:
a first input terminal for an input signal; and
a first output terminal for a first sampled signal generated from an input signal;
a second sampling switch comprising:
a second input terminal coupled to the first output terminal of the first sampling switch by a first communication path; and
a second output terminal for a second sampled signal generated from the first sampling signal;
an analog-to-digital converter coupled to the first sampling switch by a second communication path;
a digital memory coupled to the analog-to-digital converter; and
an analog error comparison module coupled to the second output terminal of the second sampling switch and to the digital memory, the analog error comparison module comprising a third output terminal for an analog error signal generated based on a comparison of the second sampled signal with information stored in the digital memory.

18. The circuit of claim 17, wherein the first and second sampling switches each comprise an equalization module operable to reset the respective sampling switch to an initial value.

19. The circuit of claim 17, wherein:
the first sampling switch comprises at least two metal oxide semiconductor field effect transistors (MOSFETs); and
the primary carrier type of the MOSFETs is negative.

20. The circuit of claim 17, wherein:
the second communication path comprises an analog memory, the analog memory comprising a constant current source producing current at a constant rate; and
the analog memory delays communication of the first sampled signal to the analog-to-digital converter by a predetermined time that is determined by the rate of the constant current source.

* * * * *

UNITED STATES PATENT AND TRADEMARK OFFICE
CERTIFICATE OF CORRECTION

PATENT NO. : 6,977,600 B2 Page 1 of 1
APPLICATION NO. : 10/821034
DATED : December 20, 2005
INVENTOR(S) : Jiang et al.

It is certified that error appears in the above-identified patent and that said Letters Patent is hereby corrected as shown below:

Column 4, Line 57, after "embodiments", delete "nts".

Signed and Sealed this

Twenty-third Day of January, 2007

JON W. DUDAS
*Director of the United States Patent and Trademark Office*